United States Patent
BuAbbud et al.

(10) Patent No.: US 6,542,382 B2
(45) Date of Patent: *Apr. 1, 2003

(54) DENSELY ARRANGED ELECTRICALLY SHIELDED COMMUNICATION PANELS

(75) Inventors: George H. BuAbbud, South Lake, TX (US); John W. Matthes, Southlake, TX (US); Janet A. Bradshaw, Flower Mound, TX (US); Muneer Zuhdi, Lewisville, TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/947,154

(22) Filed: Sep. 5, 2001

(65) Prior Publication Data

US 2002/0030980 A1 Mar. 14, 2002

Related U.S. Application Data

(63) Continuation of application No. 09/410,975, filed on Oct. 4, 1999.
(60) Provisional application No. 60/135,623, filed on May 24, 1999.

(51) Int. Cl.⁷ ................................................ H05K 9/00
(52) U.S. Cl. ........................ 361/816; 361/799; 361/800; 439/668
(58) Field of Search ................................. 361/788, 799, 361/803–805, 818, 825–832, 796, 797, 798; 439/578–582, 688, 49, 50; 211/26, 41.17; 710/126, 131

(56) References Cited

U.S. PATENT DOCUMENTS

| | | | | |
|---|---|---|---|---|
| 4,493,010 A | * | 1/1985 | Morrison et al. ........... 361/698 |
| 4,820,200 A | * | 4/1989 | Lau ............................. 439/607 |
| 5,070,430 A | * | 12/1991 | Meusel et al. ............... 361/775 |
| 5,130,986 A | | 7/1992 | Babb et al. |
| 5,430,615 A | * | 7/1995 | Keeth et al. ................. 361/788 |
| 5,520,554 A | | 5/1996 | Henningsson et al. |
| 5,546,292 A | | 8/1996 | Hill et al. |
| 5,641,294 A | * | 6/1997 | Beard ......................... 439/247 |
| 5,652,697 A | * | 7/1997 | Le ............................. 174/35 R |
| 5,913,701 A | * | 6/1999 | Olson et al. ................. 439/668 |
| 6,080,930 A | * | 6/2000 | Lommen et al. ........ 174/35 GC |
| 6,166,919 A | * | 12/2000 | Nicolici et al. ............. 361/800 |
| 6,241,562 B1 | * | 6/2001 | Benda et al. ................ 439/731 |
| 6,243,273 B1 | * | 6/2001 | Beun et al. .................. 361/796 |
| 6,327,155 B1 | * | 12/2001 | Niepmann et al. .......... 361/757 |

FOREIGN PATENT DOCUMENTS

| | | |
|---|---|---|
| DE | 8803544.1 | 7/1988 |
| EP | 412045 A2 | 2/1999 |

* cited by examiner

*Primary Examiner*—Albert W. Paladini
*Assistant Examiner*—Tuan Dinh
(74) *Attorney, Agent, or Firm*—Jones Day

(57) ABSTRACT

An apparatus for supporting a plurality of densely arranged electrically shielded communication panels includes a rack that supports at least two panels. The panels are supported adjacent to each other by the rack, and each panel includes at least two sides with a printed circuit on one side and a conductive sheet on the other side. In addition, the conductive sheet on each of the panels is coupled to an electrical connection point on the rack when the panel is placed in the rack. The two panels are placed in the rack such that the printed circuit of one of the panels is electrically shielded by the conductive sheet on another, closely aligned other one of the panels.

20 Claims, 3 Drawing Sheets

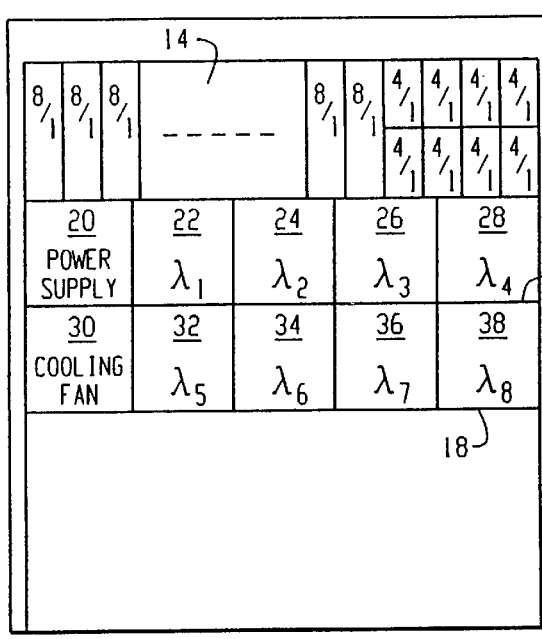
Fig. 1
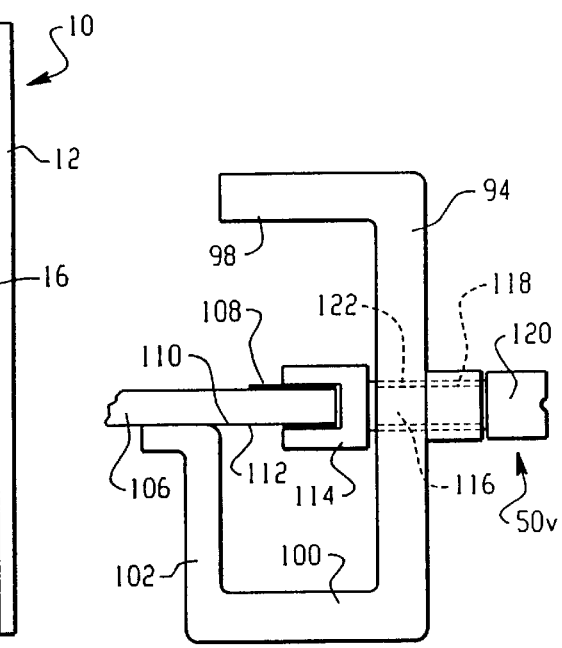
Fig. 4
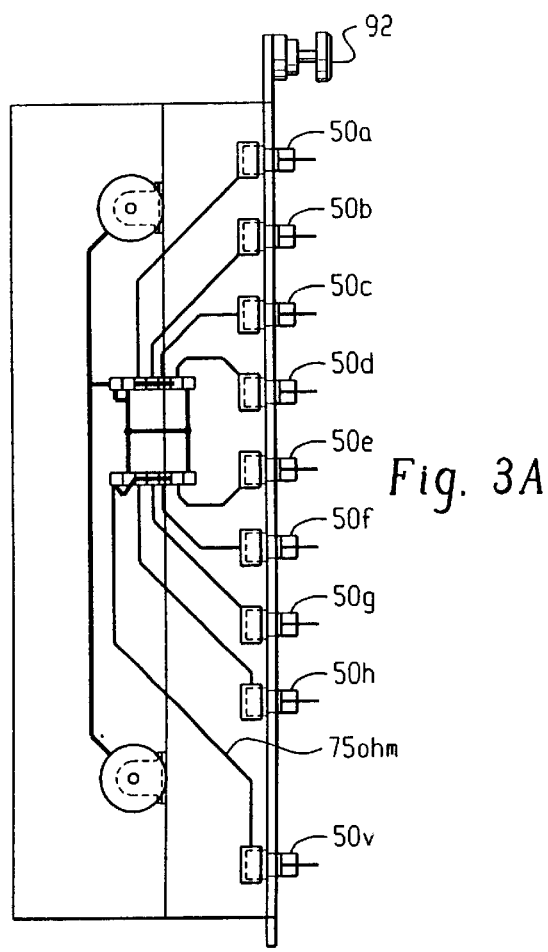
Fig. 3A
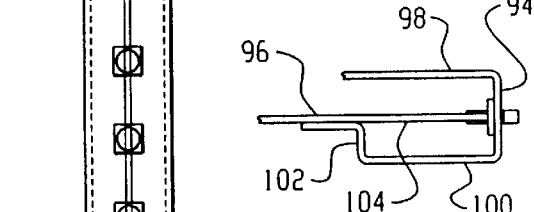
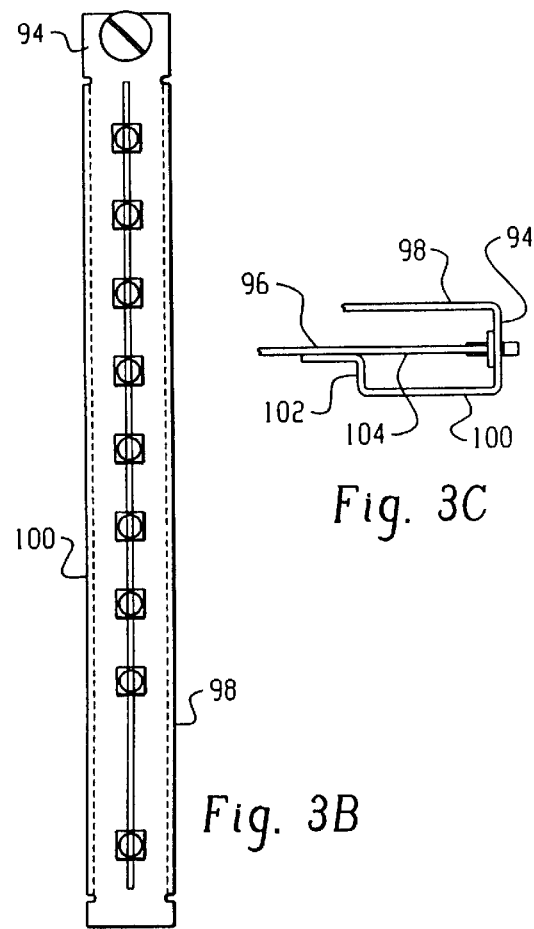
Fig. 3C
Fig. 3B

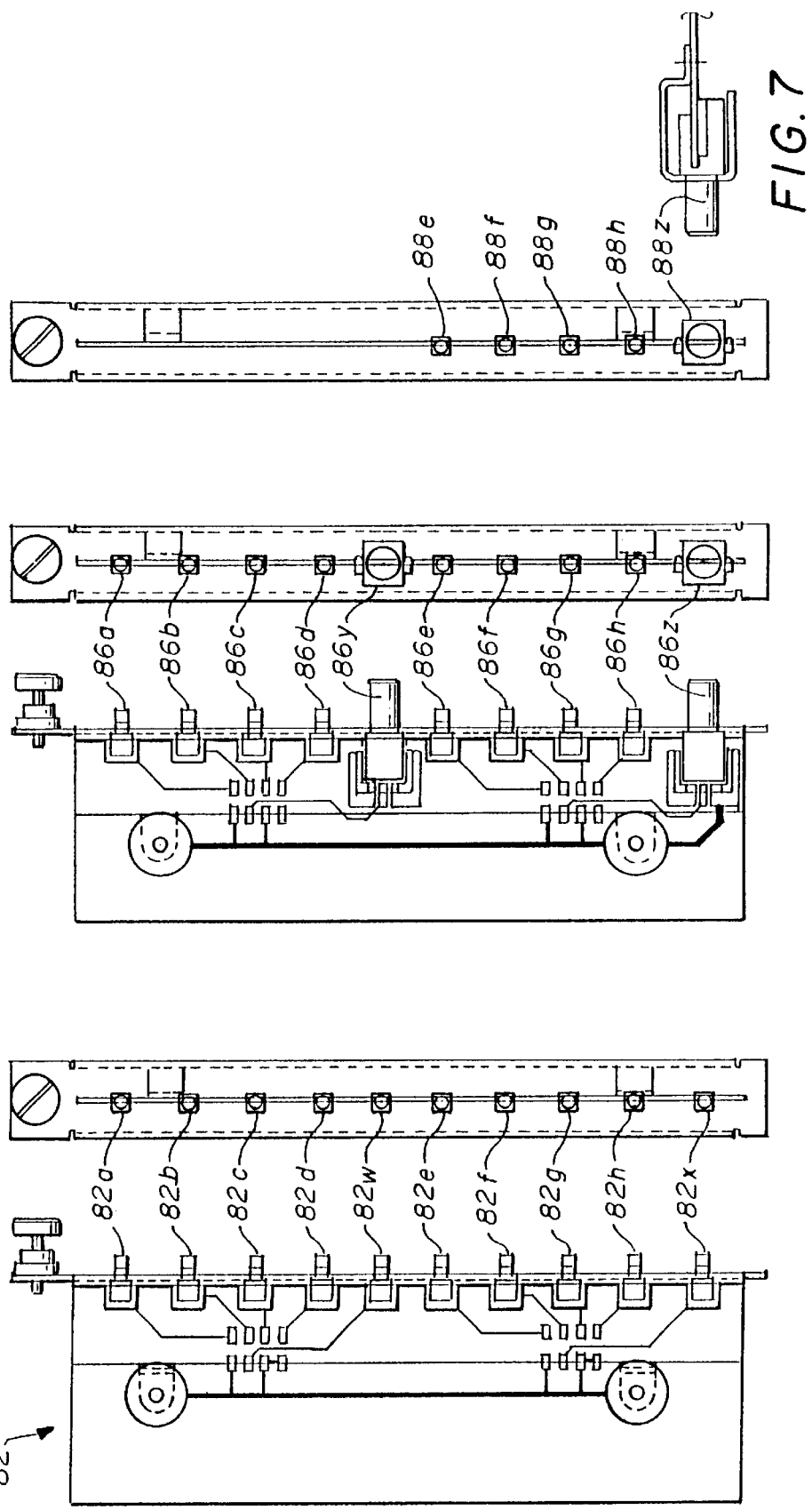

12,345,678

DENSELY ARRANGED ELECTRICALLY SHIELDED COMMUNICATION PANELS

CROSS-REFERENCE TO RELATED APPLICATION

This application is a continuation of U.S. application Ser. No. 09/410,975, filed Oct. 4, 1999, and claims the benefit of Provisional application No. 60/135,623, filed May 24, 1999.

BACKGROUND

FIELD OF THE INVENTION

This invention relates to communication distribution equipment, and more specifically to methods and apparatus for supporting a multiplicity of densely arranged or packed electrical shielded communication panels, each of which has a ground or conductive sheet covering the back side of the panel to provide back side shielding to the circuitry on that same panel as well as front side shielding to an adjacent panel.

SUMMARY

An apparatus for supporting a plurality of densely arranged electrically shielded communication panels includes a rack that supports at least two panels. The panels are supported adjacent to each other by the rack, and each panel includes at least two sides with a printed circuit on one side and a conductive sheet on the other side. In addition, the conductive sheet on each of the panels is coupled to an electrical connection point on the rack when the panel is placed in the rack. The two panels are placed in the rack such that the printed circuit of one of the panels is electrically shielded by the conductive sheet on another, closely aligned another one of the panels.

BRIEF DESCRIPTION OF THE DRAWINGS

FIG. 1 is a diagrammatic representation of a support structure or cabinet having at least one panel area, or rack with dimensions suitable for supporting densely-aligned panels of the present invention. Other panel areas or racks of the support structure or cabinet may include power supplies, light-emitting generators, cooling fans, and the like;

FIGS. 3a, 3b, and 3c are a side view, front view, and bottom view respectively of one embodiment of electrically-shielded panels of the present invention suitable for being densely arranged with similar type panels;

FIG. 4 is a highly enlarged and detailed view of the FIG. 3c bottom view for illustrating details of the panel;

FIGS. 5a and 5b show still another embodiment of the shielded panels of the present invention;

FIGS. 6a, 6b and 6c show yet another embodiment of a panel of the present invention suitable for being densley arranged with like panels; and FIG. 7 is another bottom view of the different type connector terminals used on the electrically-shielded panels of the present invention.

DETAILED DESCRIPTION

Figure 2:
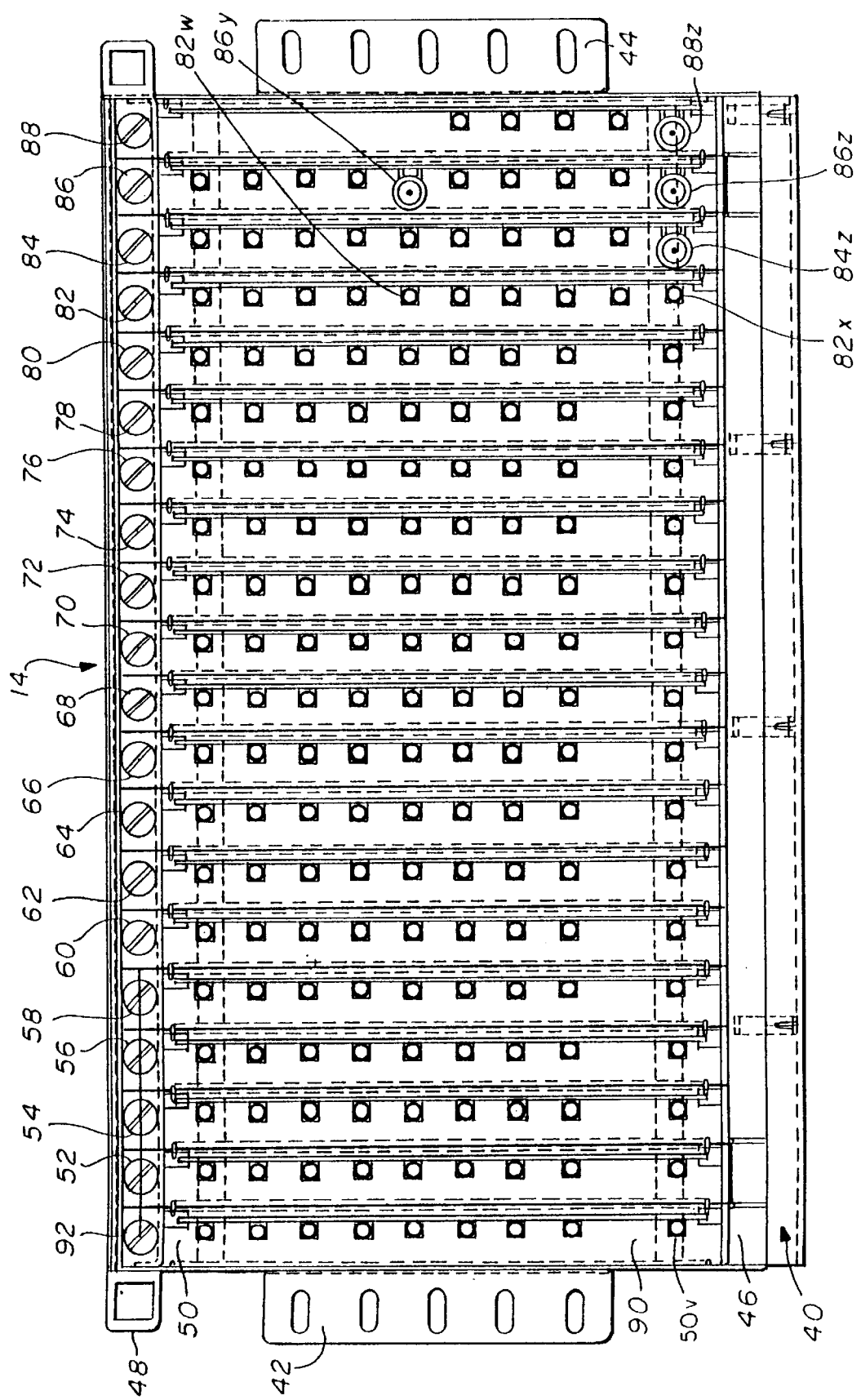
FIG. 2 shows the panel area of FIG. 1, which receives the densely-aligned shielded panels of the present invention.

Referring now to FIG. 1, there is shown a support structure or cabinet 10, which, in the embodiment shown, has at least one panel area or rack area 12 as well as second and third panel or rack areas 16 and 18. It should be appreciated that the distribution within the structure or cabinet 10 may well include other areas for different panels, including other areas for panels of the present invention, such as panel or rack area 12. However, for explanation purposes only, there is shown one panel or rack area 12, a panel or rack area 16 with a power supply 20 and four optical transmitters 22–28 for generating light at specific wavelengths of light commonly referred to as λ. The panel or rack area 18 typically might include a cooling fan 30 as well as four other additional optical-transmitting devices 32–38 for generating wavelengths of light still different from those of panels 22, 24, 26, and 28 above. Cabinet 10 includes an electrical connection point 11 which typically is connected to ground.

Referring now to FIG. 2, there is shown a group of panels 14 located in the panel or rack area 12 supported by the cabinet structure 10. Typically, the panel or rack area 12 will include a rack or support pocket 40, which will typically be a box-like structure supported in the cabinet 10 by support brackets 42 and 44. The receiving rack 40 will include at least a bottom support member 46 and a top support member 48. In the embodiment shown, there are 20 densely-aligned and arranged connection panels 50 through 88. Also in the embodiment shown, there is a front portion or face plate on each of the panels, such as face plate 90 on panel 50. Each front portion or face plate includes a mounting screw or lug 92 received by support bracket 48. Also as shown in FIG. 2, it is seen that panels 50 through 80 have eight input terminals in one group and a single output terminal at the bottom of the rack. As will be discussed later, the eight top terminals 50a through 50h are for receiving up to eight different input signals which may have the same or different frequencies, which signals are then combined and provided as a single output on the bottom output terminal 50. Panels 82 through 88, on the other hand, are dual combining circuits. That is, there are two combining circuits on each panel. The panels illustrated in FIG. 2 show four different types of dual panels.

As shown, panel 82 includes 10 connectors of the same type. The first four top connectors are input terminals, as discussed above. The next terminal, however, indicated in the drawing as 82w, is a first output terminal providing a combined output to the signals received from the four top connectors. In a similar manner, the next four terminals are the input terminals for the second combining circuit on panel 82, and terminal 82x is the output terminal for the combined signals received from the bottom four input terminals.

Panel 84 is almost identical to panel 82, except the lower-most output terminal 84z is larger than terminal 82x and is for connecting to a larger connection terminal on heavy-duty coaxial cables. Panel 86 is similar to panel 84, except the output terminal 86y is also a large output terminal of the same type as 84z. This larger connection terminal is often referred to as an "F" connector. It is also noted that the panel 88 does not include the top four input terminals or the top output terminals, as did panels 82, 84, and 86. In some instances, the circuits may be on the printed circuit board and just not brought to the front of the panel or in other instances, the circuit boards may be manufactured without these second circuits.

Referring now to FIGS. 3a, 3b, and 3c, there is shown a side view, a front view and a bottom view of the panel 50, which, of course, is also similar to the panels 52 through 80. These views clearly show the connecting lug 92 which is attached to the face plate or front portion 94 of panel 50. As shown more clearly in FIG. 3C, a printed circuit board 96 extends perpendicularly to the face plate or front portion 94 of panel 50. The face plate or front portion 94 of the panel itself includes a first edge member 98 for support and a second support member 100, which it will be noticed also includes an extension 102 which abuts the conductive sheet 112 on the backside 104 of the printed circuit board 96. Although it will be appreciated that various and different types of printed circuit boards may benefit from the teachings of the present invention, according to one embodiment the circuit board is used for combining electrical RF signals, each having a bandwidth around a different center frequency. The printed circuit board will include one connection path from each of the input terminals 50a through 50h such that each of these terminals provides a constant input impedance, such as, for example, 75 ohms. A single printed connection path will run from the common connection point of the output terminal 50v, and would also provide a constant impedance from the connection point to the output terminal.

Referring now to FIG. 4, there is shown a highly-enlarged view of the bottom view FIG. 3c. As shown, the printed circuit board 96 will include an insulating substrate 106, having a front side with a printed circuit thereon. In the portion of the circuit board shown in FIG. 4, part of the printed circuit is shown as section 108. The printed circuit board will also include on the back side 10 of the substrate 106 a conductive sheet 112, which is substantially co-extensive with the overall size of the printed circuit board. As will be appreciated by those skilled in the art, the conductive sheet 112 will typically act as a grounding plane to provide electrical shielding. Also as shown, the extension 102 of portion 94 of panel 50 is in electrical contact with the conductive sheet 112. Therefore, as shown in the Drawings, is should be understood that there is a low resistance conductive path from conductive sheet 112 (grounding plane), through extension 102, through front panel 94 to rack 40 and cabinet 10 and then through rack 40 and cabinet 10 to an electrical grounding connection point.

Also as shown in the figures, and more clearly in FIG. 4, the connection terminals 50a through 50h and 50v include a rear portion 114; a throat portion 116 and an outward securing portion 118, which may be unitary with the cable-receiving portion 120. This type terminal is shown such that the throat portion 116 extends through an aperture 122 in front panel 94 to which is then attached the outward portion 118. As shown, of course, the diameter of portions 114 and 118 are larger than the aperture at 122 such that the terminal may be secured tightly to the faceplate 94. This may be accomplished by tightening the outward portion 118 on threads cut into the portion 116. This type of terminal may be referred to as an edge terminal, as it makes an electrical connection to the edges of conductive plate 112 and circuit portion 108 without requiring soldering or other permanent attachments. For example, the printed circuit portion 108 and the conductive sheet 112 are in a tight frictional electrical contact with conductors 116 and 118 respectively on the internal portion of the terminal 114.

Referring now to FIGS. 5a and 5b, there is shown a side view and front view of the dual combination panel 82. As can readily be seen, this panel includes a first portion or combination circuit which has input terminals 82a through 82d, which provide their inputs to a single output terminal 82w and a second circuit, which includes inputs 82e through 82h, which have their inputs combined and provided on a single output 82x.

Referring now to FIGS. 6a and 6b, there is shown a panel design similar to that of panel 86. It will be appreciated from FIGS. 6a and 6b, along with FIG. 5a, that panel 86 is substantially similar as the panel shown in FIG. 5a, except it includes two heavy-duty connectors 86y and 86z. Although there is no illustration shown for panel 84, it will substantially similar to the dual circuitry with respect to FIG. 5a except it will include one small connector, such as connector 82x and one large output connector such as 86z.

Finally, FIG. 6c shows a front portion suitable for use with the dual circuit of FIG. 6a where the first portion of the circuit, having inputs 88a through 88d and output 82x are not brought out to the front panel. Again, as mentioned above, the circuitry portion used by the input terminals 88a through 88d and output terminal 86y may either be provided and not brought to the front of the panel, or simply not printed onto the circuit board.

FIG. 7 shows the bottom view of the panel such as shown in FIGS. 6a, 6b, and 6c.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

We claim:

1. An apparatus for supporting a plurality of panels, comprising:

a rack for supporting at least two panels, the rack including an electrical connection point; and said at least two panels supported adjacent to each other by the rack, wherein each of the panels includes at least two sides with a printed circuit on one side and a conductive sheet on the other side, and wherein the conductive sheet is coupled to the electrical connection point on the rack when the panel is placed in the rack;

wherein the at least two panels are placed in the rack and closely aligned such that the printed circuit of one of the panels is electrically shielded by the conductive sheet on another one of the panels, and wherein each of the at least two panels comprises:

a face plate;

a printed circuit board coupled to the face plate and including a substrate having two sides, the printed circuit on one side of the substrate, and the conductive sheet on the other side of the substrate; and a low resistance path between the conductive sheet and the electrical connection point on the rack.

2. The apparatus of claim 1, wherein the face plate includes a mounting device that couples the face plate to the rack, and wherein the mounting device provides an electrical connection between the panel and the electrical connection point on the rack.

3. The apparatus of claim 1, wherein the printed circuit board is coupled perpendicularly to the face plate.

4. The apparatus of claim 1, wherein the face plate comprises:

a support member that couples the conductive sheet to the face plate, and wherein the face plate is coupled to the electrical connection point on the rack.

5. The apparatus of claim 1, wherein the electrical connection point on the rack is coupled to electrical ground, and the conductive sheet on each substrate is a ground plane.

6. The apparatus of claim 1, wherein the conductive sheet on each substrate covers substantially all of one side of the substrate.

7. The apparatus of claim 1, wherein the plurality of panels includes at least twenty panels.

8. The apparatus of claim 1, further comprising a plurality of connectors coupled to each panel for receiving cables carrying electrical signals.

9. The apparatus of claim 2, wherein the mounting device is a screw.

10. The apparatus of claim 8, wherein the plurality of connectors are edge connectors.

11. The apparatus of claim 8, wherein the electrical signals are radio frequency (RF) signals.

12. The apparatus of claim 8, wherein each connector provides a constant input impedance.

13. The apparatus of claim 8, wherein the printed circuit on each substrate includes a combining circuit that is coupled to the plurality of connectors and combines the plurality of electrical signals to generate an output signal.

14. The apparatus of claim 8, wherein the printed circuit on each substrate includes a plurality of combining circuits, and wherein each combining circuit is coupled to two or more of the plurality of connectors and combines the electrical signals from the two or more connectors to generate an output signal.

15. The apparatus of claim 13, further comprising an output connector coupled to each panel, wherein the output signal from the printed circuit is coupled to the output connector.

16. The apparatus of claim 14, further comprising a plurality of output connectors coupled to each panel, wherein each output connector is coupled to the output signal from one of the plurality of combining circuits.

17. The apparatus of claim 15, wherein the output connector is a coaxial cable connector.

18. The apparatus of claim 15, further comprising an impedance coupled between each of the plurality of connectors and the output connector.

19. The apparatus of claim 16, wherein one or more of the output connectors are coaxial cable connectors.

20. A method of supporting and shielding a plurality of panels in a rack, comprising the steps of:

providing an electrical connection point in the rack;

providing a conductive sheet on one side of each of the plurality of panels and a printed circuit on an opposite side of each of the panels; and supporting the plurality of panels in the rack such that the conductive sheet of at least one of the panels faces the printed circuit of another, closely aligned another one of the panels, wherein the conductive sheet is coupled to the electrical connection point in the rack, and wherein each of the plurality of panels comprises:

a face plate;

a printed circuit board coupled to the face plate and including a substrate having two sides, the printed circuit on one side of the substrate, and the conductive sheet on the other side of the substrate; and a low resistance path between the conductive sheet and the electrical connection point on the rack.

* * * * *